(12) United States Patent
Burr (10) Patent No.: US 6,664,608 B1
(45) Date of Patent: Dec. 16, 2003

(54) BACK-BIASED MOS DEVICE (75) Inventor: James B. Burr, Foster City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/996,705

(22) Filed: Nov. 30, 2001

(51) Int. Cl.$^7$ .......................... H01L 29/00; H01L 29/76; H01L 29/94; H01L 31/062
(52) U.S. Cl. ...................... 257/549; 257/369; 257/372; 257/373
(58) Field of Search ................................ 257/338, 369, 257/375, 376, 548, 549, 372, 373

(56) References Cited

U.S. PATENT DOCUMENTS

| | | | |
|---|---|---|---|
| 4,910,563 A | 3/1990 | Tuska et al. | 357/23.4 |
| 4,980,744 A | 12/1990 | Watanabe et al. | 357/42 |
| 5,138,420 A | 8/1992 | Komori et al. | 357/42 |
| 5,508,549 A | 4/1996 | Watanabe et al. | 257/370 |
| 5,899,714 A * | 5/1999 | Farrenkopf et al. | 257/549 |
| 6,218,708 B1 | 4/2001 | Burr | 257/372 |

FOREIGN PATENT DOCUMENTS

JP   5-6962   * 1/1993   ................. 257/372

* cited by examiner

Primary Examiner—Steven Loke
(74) Attorney, Agent, or Firm—Gunnison, McKay & Hodgson, L.L.P.; Serge J. Hodgson (57) ABSTRACT A plurality of p-wells and n-wells are formed in a front side of a bulk material, and a plurality of n layers and p layers are alternately formed within the bulk material between a back side of the bulk material and the plurality of n-wells and p-wells. The plurality of n layers are electrically isolated from one another and respectively route different potentials to selected ones of the plurality of n-wells, and likewise, the plurality of p layers are electrically isolated from one another and respectively route different potentials to selected ones of the plurality of p-wells.

20 Claims, 8 Drawing Sheets

FIG. 9

BACK-BIASED MOS DEVICE

BACKGROUND OF THE INVENTION

1. Field of the Invention

The present invention generally relates to complimentary metal oxide semiconductor (CMOS) transistor devices, and in particular, the present invention relates to a device structure and method which facilitate the retrofitting of standard CMOS design layouts into back-biased CMOS transistor configurations. Although not limited thereto, the present invention is especially applicable to low-voltage CMOS (LVCMOS), or ultra-low power CMOS(ULP), implementations.

2. Description of the Related Art

Figure 1A:
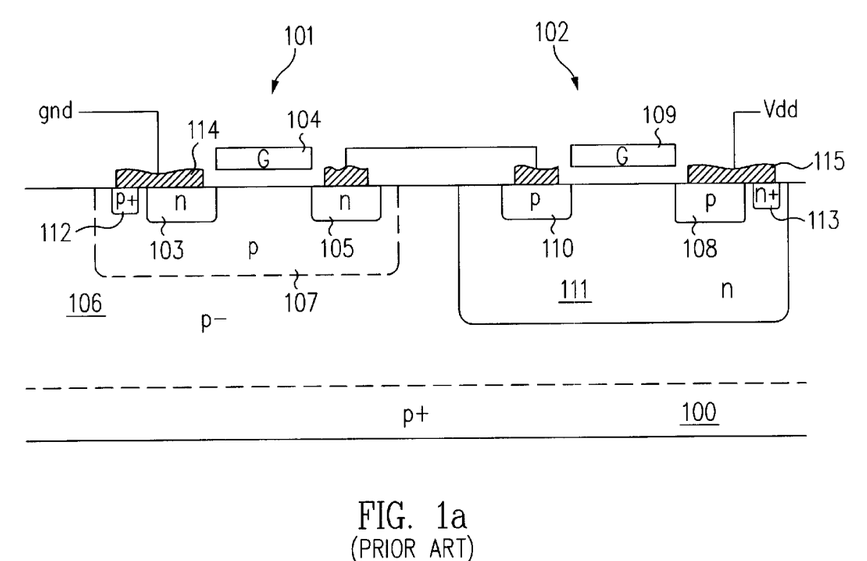
FIGS. 1(a) and 1(b) illustrate conventional CMOS inverter configurations in which the substrate potentials are tied to the ground and source voltages.

FIG. 1(a) illustrates a standard CMOS inverter design having an NFET 101 and a PFET 102, each of which essentially constitutes a three-terminal device. Basic component parts of the NFET 101 include an n-region source 103, a gate electrode 104, an n-region drain 105, and a p⁻ bulk substrate 106. Typically, the layer 106 is a p⁻ epitaxial layer grown on a p⁺ substrate 100. The NFET 101 may be formed in a p-well 107 as shown. The PFET 102 includes p-region source 108, a gate electrode 109, a p-region drain 110, and an n-well 111. In addition, reference numeral 112 denotes a p⁺ plug which forms a bulk terminal or well tie for the bulk material 106, and reference numeral 113 is representative of an n⁺ plug forming a well tie for the n-well 111.

In the exemplary CMOS design of FIG. 1(a), the well contact 112 of the bulk material 106 is shorted to the grounded source terminal 103 of the NFET 101 by way of a metallic rail contact 114. Likewise, the well contact 113 of the n-well 111 is shorted to the source terminal 108, connected to a source voltage Vdd, by way of a metallic rail contact 115. Thus, in this example, the substrate bias of the NFET 101 is fixed at GND, and that of the PFET 102 is fixed at Vdd.

Figure 1B:
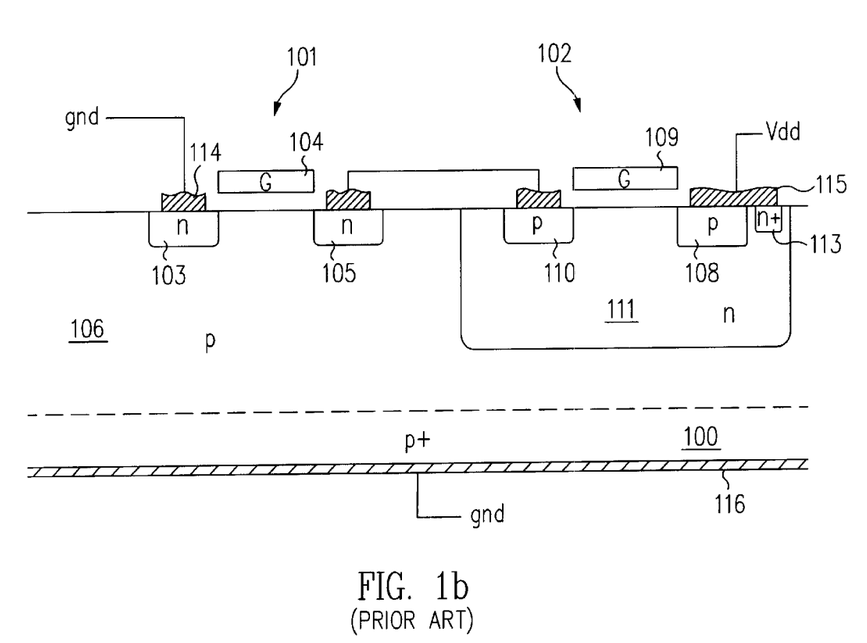

FIG. 1(b) illustrates a similar design, except that the substrate or bulk of the NFET 101 is biased to ground by way of a metallic back plane 116, rather than by way of the well tie 112 shown in FIG. 1(a).

It is noted that in the three terminal inverter design of FIGS. 1(a) and 1(b), a source of the NFET is tied to ground and the same of the PFET is tied to Vdd. While the source is tied to ground or Vdd in the case of inverters, such is not the case for compound gate structures with transistors in series, or pass transistor logic. In these topologies, some of the devices may be four terminal devices having different source and bulk potentials.

There are a number of factors which contribute to the magnitude of a transistor device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a devices's threshold voltage by a few tens or even hundreds of millivolts. Further, dimensional variations (such as oxide thickness, and channel width and especially channel length), charge trapping in materials and interfaces, and environmental factors such as operating temperature fluctuations can shift the threshold voltage. Still further, low threshold devices may leak too much when their circuits are in a sleep or standby mode. Thus, particularly for low-threshold devices, it is desirable to provide a mechanism for tuning the threshold voltage to account for these and other variations. This can be accomplished using back biasing, i.e. controlling the potential between a device's well and source. See James B. Burr, "Stanford Ultra Low Power CMOS," Symposium Record, Hot Chips V, pp. 7.4.1–7.4.12, Stanford, Calif. 1993, which is incorporated herein by reference for all purposes.

A basic characteristic of back-biased transistors resides in the ability to electrically tune the transistor thresholds. This is achieved by reverse biasing the bulk of each MOS transistor relative to the source to adjust the threshold potentials. Typically, the potential will be controlled through isolated ohmic contacts to the source and well regions together with circuitry necessary for independently controlling the potential of these two regions. Exemplary of this is the structure of FIG. 2(a), which illustrates a configuration in which the well contacts are split off from the source contacts.

Figure 2A:
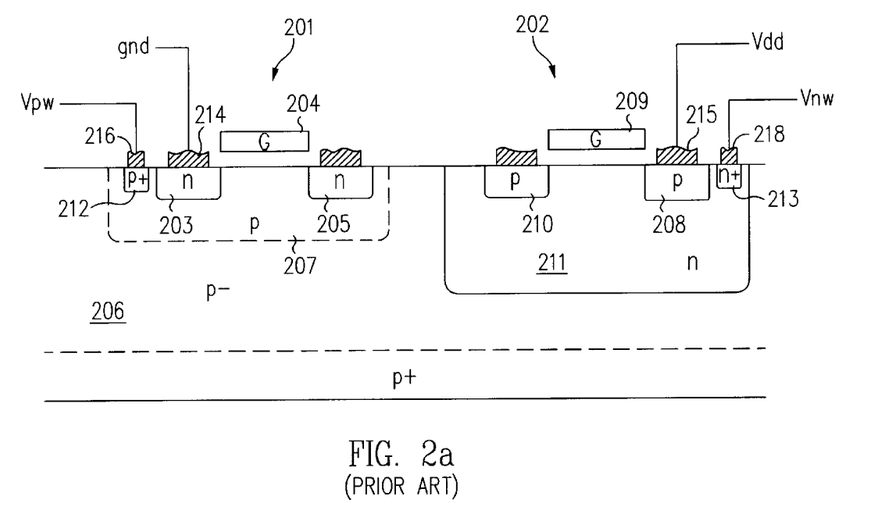
FIGS. 2(a) and 2(b) illustrate conventional CMOS configurations in which the substrate potentials are biased by the spitting off of well contacts.

That is, in the exemplary CMOS configuration of FIG. 2(a), each of an NFET 201 and a PFET 202 essentially constitutes a four-terminal device. As in FIG. 1, the NFET 201 is made up of an n-region source 203, a gate electrode 204, an n-region drain 205, and a p⁻ bulk substrate 206. Again, the NFET 201 may also include a p-well 207 as shown. Similarly, the PFET 202 includes p-region source 208, a gate electrode 209 and a p-region drain 210 formed in an n-well 211. Reference numeral 212 is a p⁺ plug which forms a bulk terminal or well tie for the bulk material 206, and reference numeral 213 is an n⁺ plug forming a well tie for the n-well 211.

In the back-biased CMOS design of FIG. 2(a), the well contact 212 of the bulk material 206 is split off from the source terminal 203 of the NFET 201 by providing a separate metallic rail contact 216 which is spaced from the metallic rail contact 214 of the source terminal 203. Rail contact 216 is connected to a bias voltage source Vpw. Likewise, the well contact 213 of the n-well 211 is split off from the source terminal 208 of the PFET 202 by providing a separate metallic rail contact 218 which is spaced from the metallic rail contact 215 of the source terminal 208. Rail contact 218 is connected to a bias voltage source Vnw. Thus, in this example, the substrate bias potential of the NFET 201 is set by Vpw, and that of the PFET 202 is set by Vnw. It is noted that in other designs, in which a number of transistors are formed in a common well, the bias potential may be routed within the surface well.

Figure 2B:
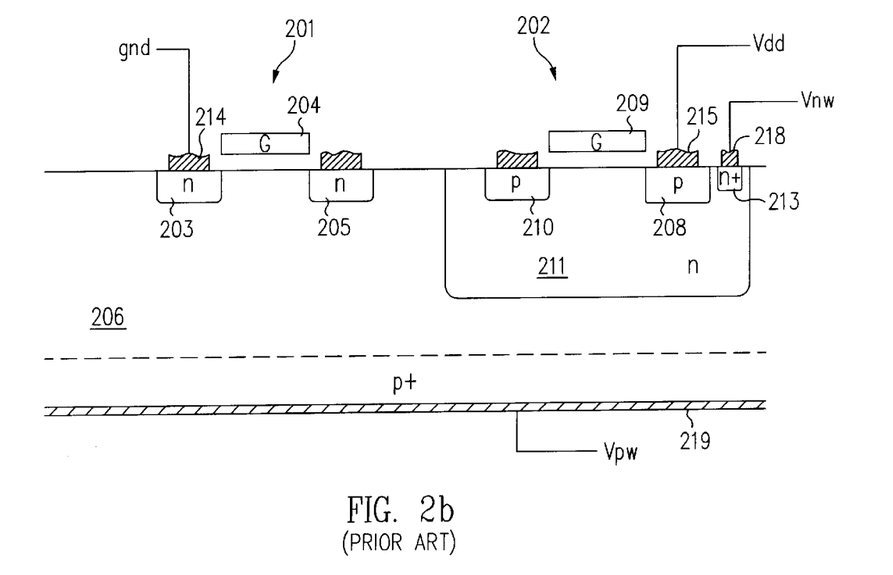

FIG. 2(b) illustrates a similar design, except that the substrate or bulk of the NFET 201 is biased to Vpw by way of a metallic back plane 219, rather than by way of the well tie 216 shown in FIG. 2(a).

Splitting off the well ties as in FIGS. 2(a) and 2(b) is a relatively simple exercise in the case where the configuration is designed into the methodology from the outset. On the other hand, in the case of existing designs not employing back-biasing, since necessary alterations include modifying the surface layout of the design, retrofitting after the fact to allow for splitting off well ties is intensively time-consuming.

This process of modifying the layout to split off the well ties includes first removing the well ties that are connected to the supply rails and then finding some space in the layout to allow for rails to separately carry the substrate potentials. These are serious issues, particularly with respect to large complex layouts having high component densities. Many designs already utilize most, if not all, to available surface area, and the provision of extra metallic rails is a severe design challenge in many instances.

SUMMARY OF THE INVENTION

In accordance with one embodiment of the present invention, a semiconductor device is provided which includes a bulk material of a first conductivity having a front side and a back side, wherein the back side of the bulk material is supplied with a first potential; first wells of the first conductivity formed in the front side of the bulk material, wherein at least one of the first wells is supplied with the first potential; second wells of the first conductivity formed in the front side of the bulk material, wherein at least one of the second wells is supplied with a second potential which is different than the first potential; third wells of a second conductivity formed in the front side of the bulk material; and a first buried layer of the second conductivity extending between the back side of the bulk material and the first, second and third wells, the first buried layer having at least one opening therein to electrically connect the bulk material with the at least one of the first wells supplied with the first potential; wherein the at least one of the second wells supplied with the second potential is electrically isolated from the at least one opening of the first buried layer by at least one of the plurality of third wells.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

A CMOS configuration is presented which allows the well ties of an existing design to be split off without affecting the layout except in a local and simple manner. The configuration routes the substrate potentials beneath the substrate surface in wells, thereby avoiding surface rails which would otherwise be needed for back-biasing the transistor devices.

That is, the substrate potentials are routed in one or more conductive sub-surface well layers as opposed to surface metal layers. While typically there is little or no room on the densely packed substrate surface of the design layout for extra metallic rails, the area beneath the substrate surface is often underutilized due to the fact that routing signals through wells is generally prohibited by the poor frequency response and high resistance of the wells. In accordance with one embodiment of the present invention, however, the wells are not carrying signals. Rather, the wells function to hold a substrate potential and are characterized by a high capacitance. As such, any local noise that gets coupled into the wells is largely attenuated.

Figure 3:
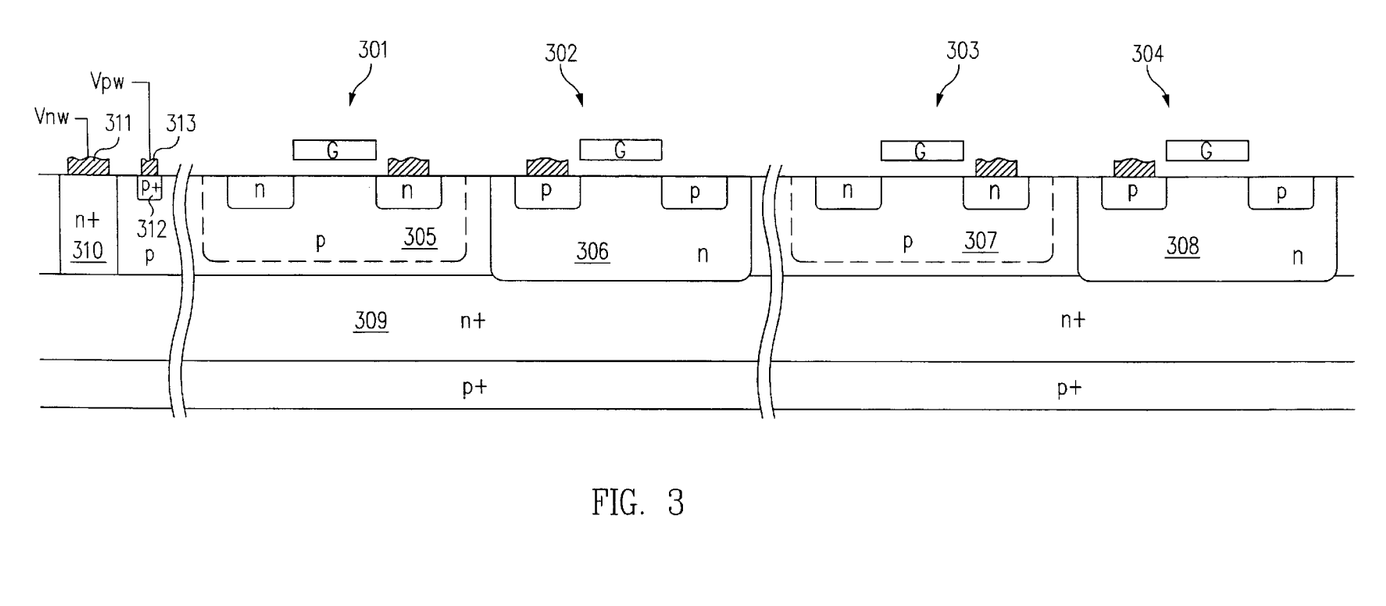
FIG. 3 illustrates a cross-sectional view of a back-biased CMOS configuration in accordance with one embodiment of the present invention.

Turning now to FIG. 3, a back-biased CMOS configuration in accordance with one embodiment of the present invention is shown. The configuration is at least partially characterized by the provision of a semiconductor sub-surface layer, as opposed to a metal surface layer or rail, for carrying the back-bias substrate potential Vnw of the PFET n-wells.

As shown, NFETs 301 and 303 are contained in p-type bulk material wells or regions 305 and 307, whereas PFETs 302 and 304 are formed in respective n-type wells 306 and 308. In some cases, the CMOS configuration may contain multiple n-type wells extending in parallel, spaced-apart tracks. In other cases, a generally rectangular n-well may be formed in which CMOS transistor pairs are formed along inner and outer peripheries thereof. Other configurations are known as well. Also, oxide layers and the like (not shown) are used to isolate transistors and transistor pairs from one another. It should be borne in mind that the back-biasing techniques in accordance with various embodiments of the present invention will apply regardless of the particularities of the CMOS configuration. Rather, these back-biasing techniques are believed to be applicable to any configuration having one or more wells to which application of a substrate back-bias potential is desired.

Referring still to FIG. 3, an $n^+$ layer 309 is used to route the bias potential Vnw to the n-wells 306 and 308. Potential Vnw is applied to the $n^+$ layer 309 via an $n^+$ plug 310, which in turn is coupled to a metallic surface contact 311 which receives the bias potential Vnw. In this configuration, the bias potential Vnw is applied to the n-wells 306 and 308 via the conductive metallic contact 311, the conductive $n^+$ plug 310 and the conductive $n^+$ layer 309. The conductive $n^+$ plug 310 may be formed instead of a metal filled trench having insulated side-walls, or the like.

Figure 4A:
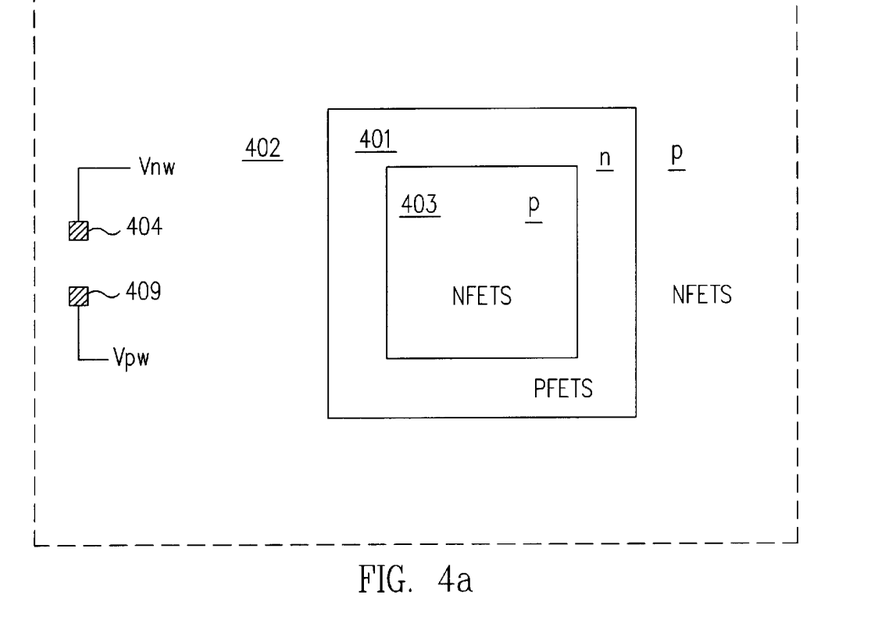
FIGS. 4(a) and 4(b) are top-views of a back-biased CMOS configuration in accordance with alternative embodiments of the present invention.

The $n^+$ plug 310 and metallic contact 311 need only be localized at the substrate surface, as opposed to a rail extending lengthwise along the design layout, thus minimizing the surface area needed for back-biasing the CMOS n-wells. An example of this is shown in FIG. 4(a). That is, in FIG. 4(a), a generally rectangular n-well 401 contains PFETs, whereas NFETs are located in p-regions 402 and 403. A single local surface contact 404 is provided in the substrate surface so as to extend down to and contact a conductive $n^+$ layer buried within the substrate, with the $n^+$ layer contacting the n-well as generally shown in FIG. 3. The bias potential Vnw is applied to the local contact 404 to generate the desired back biasing of the PFETs.

The back-bias potential for the NFETs may be supplied by way of a localized $p^+$ plug 312 and metallic contact 313 shown in FIG. 3. The top view of FIG. 4(a) similarly shows the local metallic contact 409 for application of the bias potential Vpw. Again, it is noted that the p-layer need only function to hold a substrate potential, and the characteristically high well resistance is not prohibitive in this respect.

In some configurations, the conductive $n^+$ layer for routing the bias potential Vnw may isolate p regions from one another. For example, in FIG. 4(a), a continuous planar $n^+$ layer (such as the layer 309 shown in FIG. 3) would isolate the inner p region 403 from the outer p region 402. In this case, application of the bias potential Vpw to the local contact 409 would not effectively bias the inner p region 403.

One manner of handling isolated p regions is to provide at least one metallic surface contact and associated plug for each region. Each surface contact may be formed in a local area, or all surface contacts may be formed by interconnected rails or the like. This solution allows for a continuous planar n$^+$ sub-surface layer, but utilizes surface area for the provision of multiple contacts or rails.

Figure 4B:
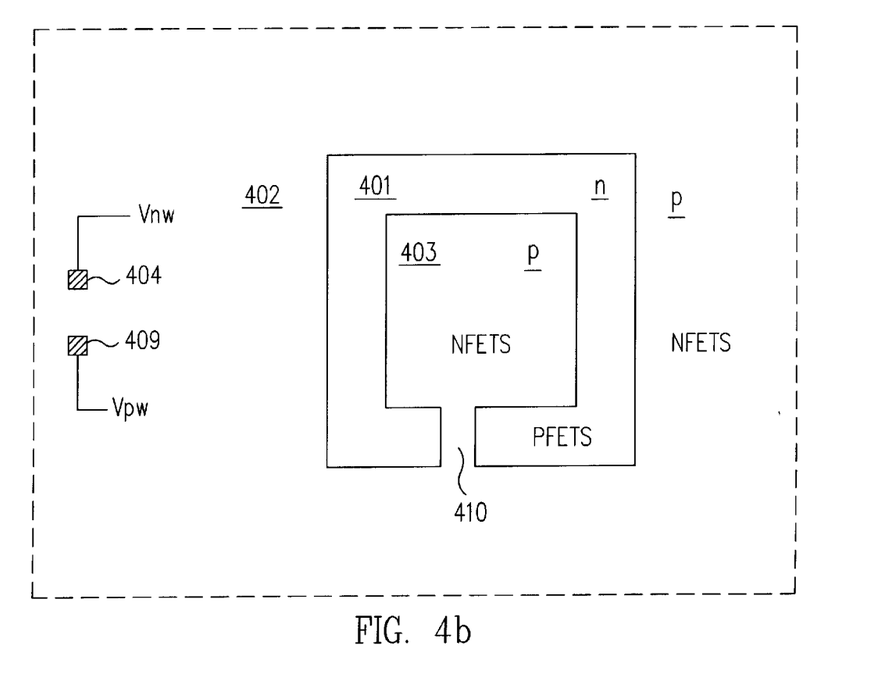

Another manner of handling the isolated p regions is to use a masking process to provide a perforation or gap within the n-well surrounding the isolated p-region. This is illustrated by way of example by reference numeral 410 in FIG. 4(b). As shown, a perforation or gap 410 is provided in the n-well 401, whereby the inner p-region 403 is electrically connected the outer p-region 402 via the perforation or gap 410.

Figure 5:
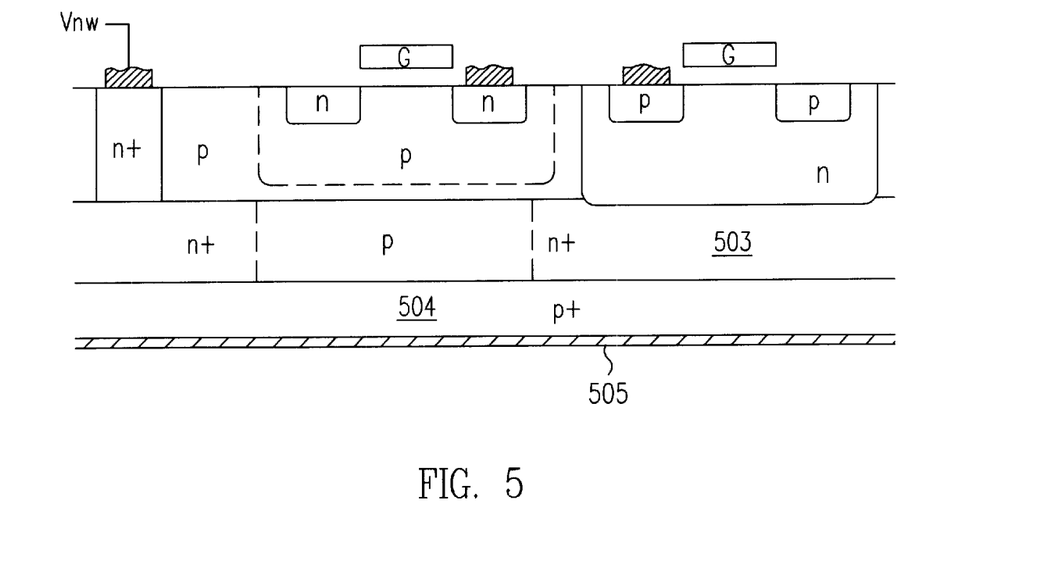
FIGS. 5 and 6 are views for explaining the routing of bias potentials to isolated bulk regions of a back-biased CMOS configuration in accordance with one embodiment of the present invention.
Figure 6:
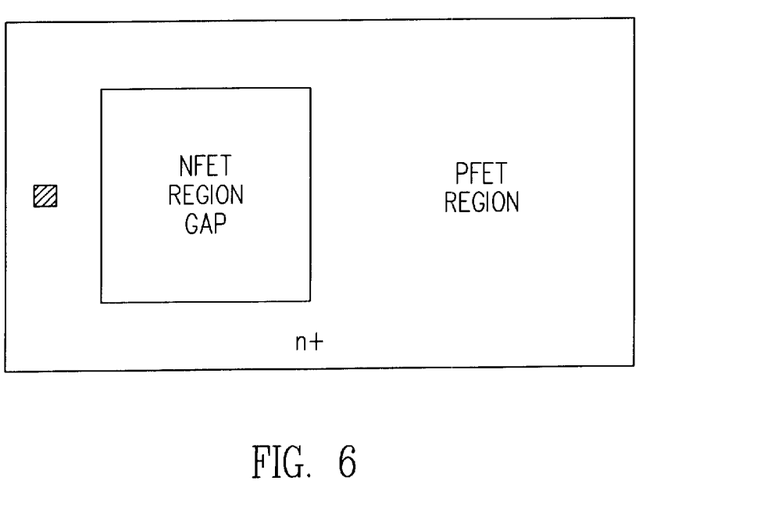

Yet another manner of handling isolated p regions uses a masking process to form a non-continuous or patterned L subsurface n$^+$ layer (i.e., the layer which routes the Vnw potential) so as to route the back bias potential Vpw to the isolated p-region through a semiconductor sub-surface p$^+$ layer. An example of this technique is shown in FIGS. 5 and 6. In FIG. 5, the potential Vpw is applied to a back plate 505, which in turn contacts the p$^+$ substrate layer 504. The n$^+$ layer 503 (corresponding to layer 309 of FIG. 3) is non-continuous or patterned as generally illustrated in FIG. 6. As such, the p$^+$ substrate is shorted to the bulk material through gaps in the n$^+$ layer. Alternatively, the potential Vpw may be routed to the p$^+$ layer by way of a local surface contact and a p$^+$ plug or insulated metal filled trench extending downward from the substrate surface. The p$^+$ plug or trench need only contact the surface p-region, since the surface p-region will connect to the p$^+$ layer through gaps in the n$^+$ layer.

As should thus be apparent, there are any number of possible variations in accordance with various embodiments of the present invention. For example, in some instances, it may be difficult to deposit the buried n-well deep below the bulk material surface using implantation techniques. That is, the distribution may be too broad for a single implant. To overcome this possibility, a counterdoped buried well may be adopted, or alternatively, the n-well may be implanted into a conventional p$^-$/p$^+$ wafer. Further, the device may be configured by lamination of the n$^+$ layer. These and other alternatives are discussed below.

In accordance with one embodiment, the doping present in the bulk material is kept light at the surface. Outside the channel, however, just a low net doping is needed. Also, it is not necessary to be overly precise as to the junction depth as long as it is sufficiently deep. One solution is to implant p-type impurities such that a desired concentration is achieved at the surface (for example, 1e15 per cm$^3$), with the H concentration increasing to a peak (for example, 2e17 per cm$^3$) at a particular depth (for example, 0.4 $\mu$m). A p-n junction would be clamped just below the peak. It may also be preferable to effect an extra-light n implant under the source/drain regions to reduce junction capacitance.

For example, a 0.4 $\mu$m junction with a 0.18 $\mu$m source drain junction depth would leave a 0.22 $\mu$m p-region under the source/drain. The depletion width at NA=2e17 per cm$^3$ is 74 nm with no voltage across the junction and 158 nm with 3V of reverse bias. It is believed that indium would be most effective for this purpose. Also, it is believed that antimony would be preferable to arsenic for the deep well since antimony is heavier, thus going deeper and narrowing the distribution. That is, in one alternative, antimony may be used to form the deep well, and indium may be used as counterdoping to suppress the surface tail.

Another alternative embodiment resides in implanting the n-well layer into a conventional p$^-$/p$^+$ wafer. In this case, the epitaxial p$^+$ silicon may be grown after the n$^+$ implant. This allows the surface silicon to be lightly doped p, and the n$^+$ profile to be very steep. The surface p$^-$ layer should be thick enough to avoid outdiffusion from the buried n$^-$ layer to interfere with the device profiles. Yet another alternative is to laminate the n$^+$ layer onto the p type wafer, and then form the p-type silicon atop the n$^+$ laminate.

Yet another variation relates to the fact that chip designers are generally interested in improving ground and power distribution, normally by way of the metal system through the front side of the chip, by distributing ground through the substrate by contacting the back side of the wafer. This would make it difficult to back bias NFETs in an n-well process, because their bodies would be shorted to ground through the substrate.

However, a buried n-well layer may be used to separate ground connections from NFET p-wells. The p$^-$ substrate underneath the buried n-well layer can be grounded through a back-side contact. This p$^-$ substrate may then be connected to surface p-wells through openings in the buried n-well layer. These openings would be surrounded by surface n-wells to isolate them from the back-biased p-wells.

In this way, grounded surface p-wells and back-biased surface p-wells are separated by surface n-wells. The grounded p-wells would be connected through openings in the buried n-well layer to the underlying grounded p$^-$ substrate.

Figure 7:
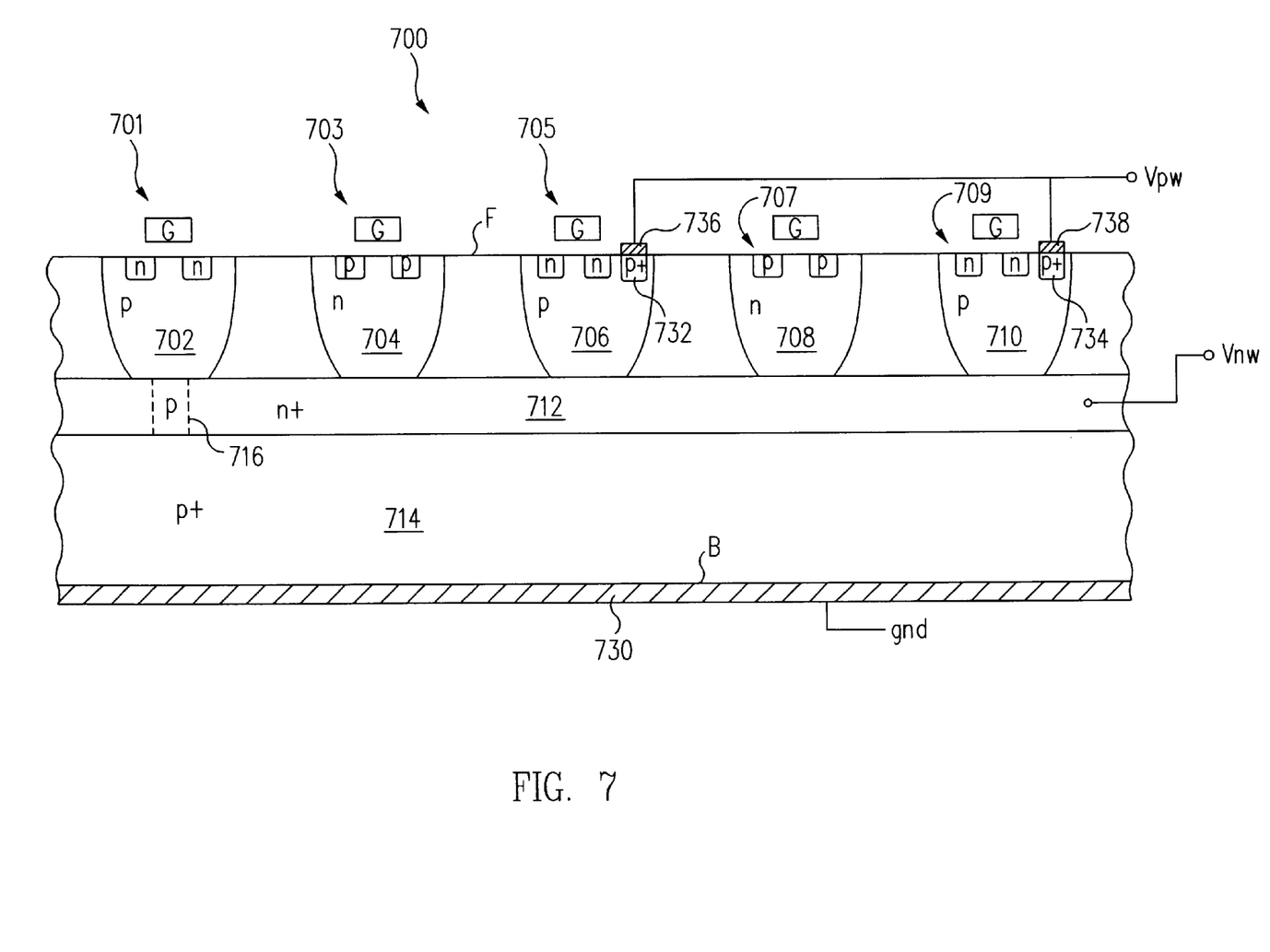
FIGS. 7, 8 and 9 are cross-sectional views of back-biased CMOS configurations in accordance with other embodiments of the present invention.

FIG. 7 is a cross-sectional view of a back-biased CMOS configuration 700 in accordance with one embodiment of the present invention. As shown in FIG. 7, the configuration 700 includes a p-type bulk material 714 having a front side F and a back side B. Formed in the front side F of the bulk material 714 are p-type bulk material wells or regions 702, 706, and 710, hereinafter p-wells 702, 706, and 710. Similarly, formed in the front side F of the bulk material 714 are n-type bulk material wells or region 704 and 708, hereinafter n-wells 704 and 708. The p-wells 702, 706, n-wells 704, 708 and p-well 710 are sometimes called the first, second, third, fourth, and fifth wells, respectively.

NFETs 701, 705, and 709 are contained in the p-wells 702, 706, and 710, respectively. PFETs 703 and 707 are contained in the n-wells 704 and 708, respectively.

Formed between the back side B of the bulk material 714 and the p-wells 702, 706, 710, n-wells 704, 708 is an n-type buried layer 712, sometimes called a first buried layer. The buried layer 712 is substantially parallel to the front side F and the back side B of the bulk material 714. As shown in FIG. 7, the p-wells 702, 706, and 710 and the n-wells 704 and 708 extend between the front side F of the bulk material 714 and the buried layer 712, and contact the buried layer 712. Thus, the n-wells 704 and 708 are electrically connected to the buried layer 712. A bias-potential Vnw is supplied, sometimes called applied, to the buried layer 712 and thus to the n-wells 704 and 708.

The back side B of the bulk material 714 is coupled to a metallic back plane 730. The bulk material 714 is supplied with ground potential gnd, sometimes called a reference voltage source, a first potential or simply ground, by way of the metallic back plane 730 although the bulk material 714 is biased to ground potential gnd using a technique other than the back plane 730 in other embodiments.

The p-well 702 is connected to the ground potential gnd via a p-type opening 716 formed in the buried layer 712. Specifically, the opening 716 extends through the buried layer 712 from the p-well 702 to the bulk material 714 and electrically connects the p-well 702 to the bulk material 714.

P+ plugs 732, 734 are formed in and form the well ties for the p-wells 706, 710, respectively. Metallic rail contacts 736, 738 contact and are electrically connected to the P+ plugs 732, 734, respectively. The bias potential Vpw is supplied to the rail contacts 736, 738 and thus to the p-wells 706, 710 by the P+ plugs 732, 734, respectively. Illustratively, the bias-potentials Vpw and Vnw are sometimes called the second and third potentials, respectively.

As set forth above, the ground potential gnd is applied to the back side B the bulk material 714, the opening 716, and the p-well 702. The buried layer 712 in combination with at least the n-well 704 separates and electrically isolates the ground potential gnd from the bias potential Vpw and the p-wells 706 and 710. To illustrate, the p-well 706 is separated and electrically isolated from the ground potential gnd applied to the back side B the bulk material 714, the opening 716, and the p-well 702 by the buried layer 712 in combination with the n-wells 704, 708.

In one embodiment, the p-wells 706, 710 are lightly doped. This may be a problem with regard to minimizing local potential fluctuations due to capacitive coupling to switching drains. In this case, a p+ layer could be implanted or grown above the n+ layer to provide a low resistance path for back biasing the NFETs.

Figure 8:
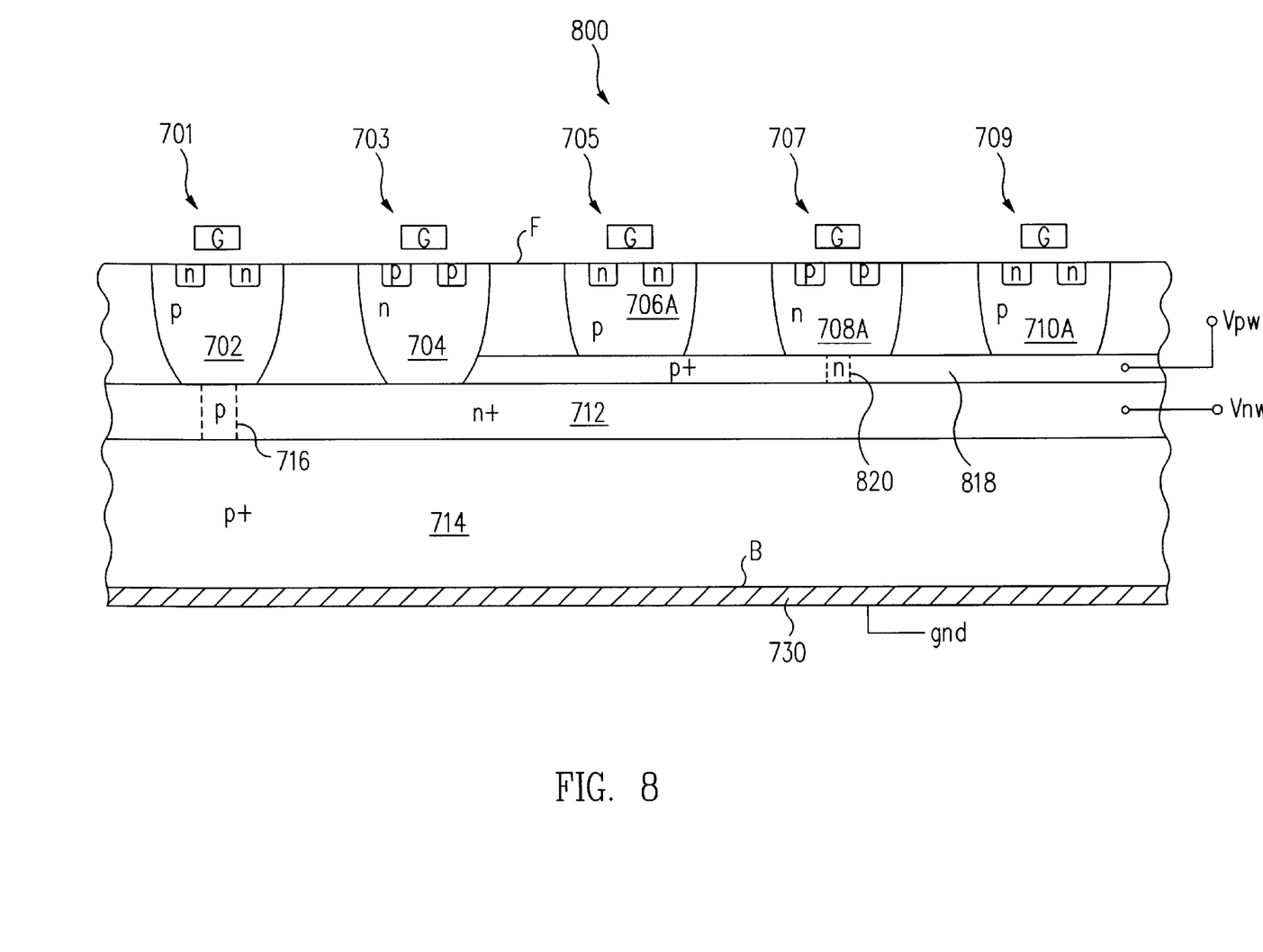

FIG. 8 is a cross-sectional view of a back-biased CMOS configuration 800 in accordance with another embodiment of the present invention. The CMOS configuration 800 of FIG. 8 is similar to the CMOS configuration 700 of FIG. 7 and only the significant differences between the CMOS configurations 700 and 800 are discussed below.

Formed between the buried layer 712 and the p-wells 706A, 710A, n-well 708A is a p-type buried layer 818, sometimes called a second buried layer 818. The buried layer 818 is substantially parallel to the front side F and the back side B of the bulk material 714.

As shown in FIG. 8, the p-wells 706A, 710A, n-well 708A extend between the front side F of the bulk material 714 and the buried layer 818, and contact the buried layer 818. Thus, the p-wells 706A, 710A are electrically connected to the buried layer 818. The bias-potential Vpw is applied to the buried layer 818 and thus to the p-wells 706A, 710A.

As set forth above, the ground potential gnd is applied to the back side B the bulk material 714, the opening 716, and the p-well 702. The buried layer 712 in combination with at least the n-well 704 separates and electrically isolates the ground potential gnd from the bias potential Vpw and the p-wells 706A, 710A and the buried layer 818.

The N-well 708A is connected to the buried layer 712 and thus to the bias potential Vnw via an n-type opening 820 formed in the buried layer 818. Specifically, the opening 820 extends through the buried layer 818 from the n-well 708A to the buried layer 712 and electrically connects the n-well 708A to the buried layer 712.

Figure 9:
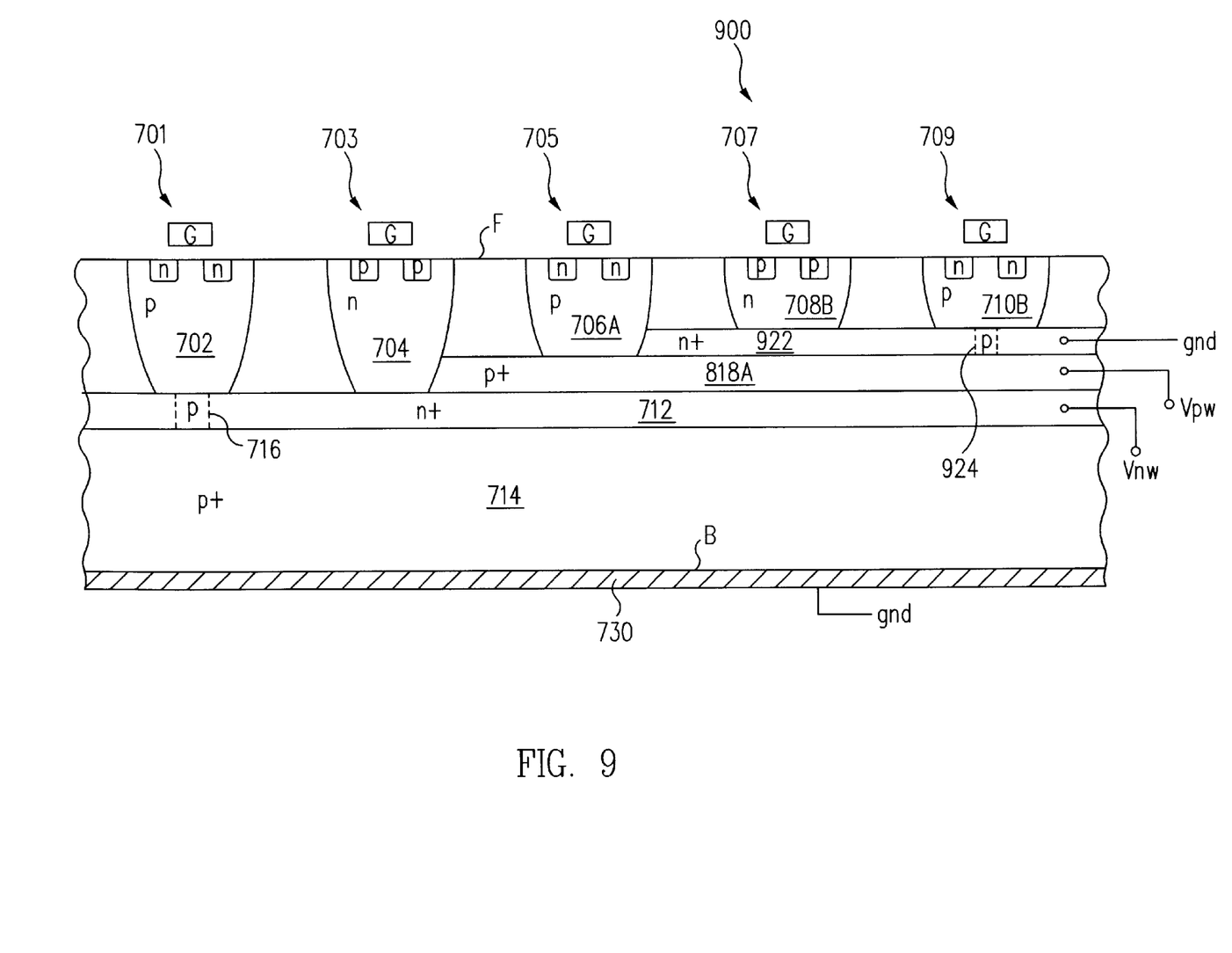

FIG. 9 is a cross-sectional view of a back-biased CMOS configuration 900 in accordance with yet another embodiment of the present invention. The CMOS configuration 900 of FIG. 9 is similar to the CMOS configuration 800 of FIG. 8 and only the significant differences between the CMOS configurations 800 and 900 are discussed below.

Referring now to FIG. 9, formed between the buried layer 818A and the n-well 708B, p-well 710B is an n-type buried layer 922, sometimes called a third buried layer 922. The buried layer 922 is substantially parallel to the front side F and the back side B of the bulk material 714.

As shown in FIG. 9, the n-well 708B, p-well 710B extend between the front side F of the bulk material 714 and the buried layer 922, and contact the buried layer 922. Thus, the n-well 708B is electrically connected to the buried layer 922. Ground potential gnd is applied to the buried layer 922 and thus to the n-well 708B.

As set forth above, the bias potential Vnw is applied to the buried layer 712 and the n-well 704. The buried layer 818A in combination with at least the p-well 706A separates and electrically isolates the bias potential Vnw from the n well 708B and the buried layer 922. To illustrate, the n-well 708B and the buried layer 922 are separated and electrically isolated from the n-well 704 and the buried layer 712.

The P-well 710B is connected to the buried layer 818A and thus to the bias potential Vpw via a p-type opening 924 formed in the buried layer 922. Specifically, the opening 924 extends through the buried layer 922 from the p-well 710B to the buried layer 818A and electrically connects the p-well 710B to the buried layer 818A.

In principle, any number of p+/n+ layers could be built up to provide multiple interconnection planes for routing power supplies in the substrate rather than in metal.

This technique may be used to implement an isolated twin-well technology, wherein both NFETs and PFETs would have separate bias potentials supplied to different groups of devices. Back-biased p-wells would be surrounded by Vdd-connected n-wells, and back-biased n-wells would be isolated by ground-connected p-wells.

If there were 6 planes: Vdd, gnd, Vnw, Vpw, Vnwmax, and Vpwmax, then back bias generation would be a simple matter of periodically transferring charge from the Vnwmax plane to the Vnw plane and the Vpwmax plane to the Vpw plane. In this case it would make the most sense to have Vnwmax and Vpwmax perform the isolation function. Back-biased p-wells would be surrounded by Vnwmax-connected n-wells, and back-biased n-wells would be isolated by Vpwmax-connected p-wells. There could in fact be fewer than 6 layers if multiple functions were merged on a single layer.

Modification of an original layout in an n-well process will now be described by way of an example. First the existing substrate and well contacts are removed from the design. This step may be completely automated and require no manual manipulation of data. Optionally, a mask is generated to define a buried n-well layer which is used to interconnect the n-wells. This may be a uniform sheet, or it may be a grid so that the low resistance p substrate is made to contact the high-resistance p− epi layer. From the surface n-well mask an n-well is then constructed which connects the surface n-wells to the buried n-well layer. Again, in many cases, this can be automated. The n-well via mask will often be the same as the n-well mask. If there are n-well rings which would otherwise create isolated p-wells, the n-well via mask is provided with gaps in the n-well rings to provide connectivity to the isolated p-wells. Finally, somewhere in the layout, the substrate and well ties are placed. This is a manual, but local variation. The bulk potentials are then distributed throughout the chip in wells, as opposed to surface metals.

In accordance with one embodiment, a configuration will be to distribute Vdd through the metal system, gnd through both the metal system and the back side, Vnw through an n+buried layer, and Vpw through a p+ buried layer. This would require a p⁺ substrate, an n⁺ layer, a p⁺ layer, and a surface p⁻ layer.

In accordance with embodiments of the present invention, the use of one or more semiconductor sub-surface layers to route the back-bias potential to the PFET and/or NFET wells is set forth. This reduces or largely eliminates the need for surface metals, thus increasing surface densities and facilitating retrofitting of densely packed existing designs. Many structural variations for realizing sub-surface routing of back-bias potentials may be contemplated by those skilled in the art.

This application is related to Burr, U.S. Pat. No. 6,218,708, issued Apr. 17, 2001, entitled "BACK-BIASED MOS DEVICE AND METHOD", which is herein incorporated by reference in its entirety.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
a bulk material of a first conductivity comprising a front side and a back side, wherein said back side of said bulk material is supplied with a first potential;
first wells of said first conductivity formed in said front side of said bulk material, wherein at least one of said first wells is supplied with said first potential;
second wells of said first conductivity formed in said front side of said bulk material, wherein at least one of said second wells is supplied with a second potential which is different than said first potential;
third wells of a second conductivity formed in said front side of said bulk material; and
a first buried layer of said second conductivity extending between said back side of said bulk material and said first, second and third wells, said first buried layer comprising at least one opening therein to electrically connect said bulk material with said at least one of said first wells supplied with said first potential;
wherein said at least one of said second wells supplied with said second potential is electrically isolated from said at least one opening of said first buried layer by at least one of said third wells.

2. The semiconductor device of claim 1, wherein said first potential is a ground potential, and said second potential is a bias potential.

3. The semiconductor device of claim 1, further comprising a second buried layer of said first conductivity extending between said first buried layer of said second conductivity and said at least one of said second wells supplied with said second potential, said second buried layer routing said second potential to said at least one of said second wells.

4. The semiconductor device of claim 1, wherein said first buried layer routes a bias potential to said at least one of said third wells.

5. A semiconductor device comprising:
a bulk material;
p-wells formed in a front side of said bulk material;
n-wells formed in said front side of said bulk material; and
n layers and p layers alternately formed within said bulk material between a back side of said bulk material and said n-wells and p-wells;
wherein said n layers are electrically isolated from one another and respectively route different potentials to selected ones of said n-wells, and wherein said p layers are electrically isolated from one another and respectively route different potentials to selected ones of said p-wells.

6. A semiconductor device comprising:
a bulk material comprising a front side and a back side;
a first well of a first conductivity in said front side of said bulk material;
a second well of said first conductivity in said front side of said bulk material;
a third well of a second conductivity in said front side of said bulk material;
a first buried layer between said back side of said bulk material and said first well, said second well and said third well, wherein said first well is electrically connected to said bulk material through an opening in said first buried layer; and
a second buried layer between said first buried layer and said second well, wherein said third well and said first buried layer electrically isolate said second buried layer and said second well from said first well.

7. The semiconductor device of claim 6 wherein said first buried layer is of said second conductivity and wherein said opening is of said first conductivity.

8. The semiconductor device of claim 6 further comprising:
a fourth well of said second conductivity, said second buried layer being between said first buried layer and said fourth well, wherein said fourth well is electrically connected to said first buried layer through an opening in said second buried layer.

9. The semiconductor device of claim 8 wherein said first buried layer is of said second conductivity, wherein said second buried layer is of said first conductivity and wherein said opening in said second buried layer is of said second conductivity.

10. The semiconductor device of claim 6 wherein said first buried layer is of said second conductivity and wherein said second buried layer is of said first conductivity.

11. A semiconductor device comprising:
a bulk material comprising a front side and a back side;
a first well of a first conductivity in said front side of said bulk material;
a second well of said first conductivity in said front side of said bulk material;
a third well of a second conductivity in said front side of said bulk material;
a first buried layer between said back side of said bulk material and said first well, said second well and said third well;
a second buried layer between said first buried layer and said second well, wherein said third well and said first buried layer electrically isolate said second buried layer and said second well from said first well;
a fourth well of said second conductivity;
a fifth well of said first conductivity;
said second buried layer being between said first buried layer and said fourth well and said fifth well; and
a third buried layer between said second buried layer and said fourth well and said fifth well, wherein said fifth well is electrically connected to said second buried layer through an opening in said third buried layer.

12. The semiconductor device of claim 11 wherein said second buried layer is of said first conductivity, wherein said third buried layer is of said second conductivity and wherein said opening is of said first conductivity.

13. A semiconductor device comprising:
   a bulk material comprising a front side and a back side;
   a first well of a first conductivity in said front side of said bulk material, said first well being supplied a first potential;
   a second well of said first conductivity in said front side of said bulk material;
   a third well of a second conductivity in said front side of said bulk material;
   a first buried layer of said second conductivity between said back side of said bulk material and said first well, said second well and said third well; and
   a second buried layer of said first conductivity between said first buried layer and said second well, wherein said second buried layer supplies a second potential to said second well and wherein said first buried layer supplies a third potential to said third well.

14. The semiconductor device of claim 13 wherein said third well and said first buried layer electrically isolate said first potential from said second potential.

15. The semiconductor device of claim 13 wherein said first well is supplied with said first potential through an opening in said first buried layer, said opening is of said first conductivity.

16. The semiconductor device of claim 13 further comprising:
   a fourth well of said second conductivity, said second buried layer being between said first buried layer and said fourth well, wherein said fourth well is supplied with said third potential through an opening in said second buried layer.

17. The semiconductor device of claim 16 wherein said opening is of said second conductivity.

18. The semiconductor device of claim 13 further comprising:
   a fourth well of said second conductivity;
   a fifth well of said first conductivity;
   said second buried layer being between said first buried layer and said fourth well and said fifth well; and
   a third buried layer of said second conductivity between said second buried layer and said fourth well and said fifth well, wherein said fifth well is supplied with said second potential through an opening in said third buried layer.

19. The semiconductor device of claim 18 wherein said opening is of said first conductivity.

20. A semiconductor device comprising:
   a bulk material comprising a front side and a back side;
   a first well of a first conductivity in said front side of said bulk material;
   means for supplying said first well with a first potential;
   a second well of said first conductivity in said front side of said bulk material;
   a third well of a second conductivity in said front side of said bulk material;
   means for supplying a second potential to said second well; and
   means for supplying a third potential to said third well, wherein said means for supplying a third potential is between said back side of said bulk material and said first well, said second well and said third well, and wherein said means for supplying a second potential is between said means for supplying a third potential and said second well.

* * * * *